United States Patent
Niederkorn

(10) Patent No.: US 7,233,198 B2
(45) Date of Patent: Jun. 19, 2007

(54) PHASE CORRECTED MILLER COMPENSATION OF CHOPPER AND NESTED CHOPPER AMPLIFIERS

(75) Inventor: Andrea Niederkorn, Tempe, AZ (US)

(73) Assignee: NXP B.V., Eindhoven (NL)

( * ) Notice: Subject to any disclaimer, the term of this patent is extended or adjusted under 35 U.S.C. 154(b) by 101 days.

(21) Appl. No.: 10/538,562

(22) PCT Filed: Dec. 18, 2003

(86) PCT No.: PCT/IB03/06045

§ 371 (c)(1),
(2), (4) Date: Jun. 15, 2005

(87) PCT Pub. No.: WO2004/055977

PCT Pub. Date: Jan. 7, 2004

(65) Prior Publication Data

US 2006/0055456 A1    Mar. 16, 2006

Related U.S. Application Data

(60) Provisional application No. 60/434,824, filed on Dec. 18, 2002.

(51) Int. Cl.
    *H03F 1/02*    (2006.01)
(52) U.S. Cl. .......................................... 330/9; 330/311
(58) Field of Classification Search ...................... None
    See application file for complete search history.

(56) References Cited

U.S. PATENT DOCUMENTS 4,994,805 A * 2/1991 Dedic et al. ................ 375/248
5,847,600 A * 12/1998 Brooks et al. .................. 330/9
6,577,185 B1 * 6/2003 Chandler et al. ............... 330/9

* cited by examiner

*Primary Examiner*—Khanh Van Nguyen
(74) *Attorney, Agent, or Firm*—Peter Zawilski

(57) ABSTRACT

A circuit architecture (200) for implementation of compensation based on Miller capacitors in multi-stage chopped amplifiers includes insertion of an additional chopper (206) in the compensation feedback (118, 120) pathway. Such compensation is more area efficient than parallel compensation and allows higher bandwidth in multistage amplifiers. The insertion of a chopper in the Miller capacitance feedback loop provides a means to selectively adjust the phase of the feedback by 180 degrees.

6 Claims, 2 Drawing Sheets

PHASE CORRECTED MILLER COMPENSATION OF CHOPPER AND NESTED CHOPPER AMPLIFIERS

CROSS REFERENCE TO RELATED APPLICATION

This application claims the benefit of U.S. provisional application Ser. No. 60/434,824 filed Dec. 18, 2002, which is incorporated herein by reference.

The present invention relates generally to electronic circuits, and more particularly relates phase corrected Miller compensation of chopper and nested chopper amplifiers.

The present invention relates generally to electronic circuits, and more particularly relates phase corrected Miller compensation of chopper and nested chopper amplifiers.

Advances in semiconductor manufacturing technology have resulted in the design and production of integrated circuits that now include many millions of transistors and other electrical circuit elements. As the level of integration has increased it has become desirable to integrate many functions onto integrated circuits. Signal amplification is one of many such functions that can be implemented in integrated circuits.

Many amplifier circuit configurations, or architectures, have been developed over the years. One family of amplifier circuit architecture is the chopper amplifier. Chopper amplifier architectures are used to remove low frequency noise and offsets. Chopper amplifier architectures are known that use parallel compensation capacitors. Capacitors formed in integrated circuits tend to consume relatively large amounts of area. Generally, in chopper amplifier architectures that use conventional parallel compensation capacitors, the size of the capacitors depends on the frequency position of the pole.

It is generally an objective of manufacturers to reduce the cost of the integrated circuits that they produce. It is also generally the case that the cost of an integrated circuit increases as its size, that is, its area, increases.

What is needed are methods and apparatus for providing compensation in chopper amplifiers while reducing the area required for their implementation, thereby reducing their cost.

Briefly, a chopper amplifier circuit arrangement is provided that includes an additional chopper in a Miller capacitance feedback path that corrects for the 180 degree phase shift.

In a further aspect of the present invention, nested chopper amplifiers may be provided with the use of additional choppers in the Miller capacitance feedback pathways. Such additional choppers have utility in terms of ensuring stability.

Choppers are used in amplifier applications that perform averaging, such as delta sigma converters. The choppers alternately apply the low frequency noise and offset due to mismatch to in-phase and 180 degree out-of-phase with the signal. The result is that the signal is preserved and the noise and offset are removed. The parallel compensation is undisturbed by the chopper and therefore no additional phase correction is required.

Various embodiments of the present invention provide Miller compensation in multistage amplifiers that are chopped to remove low-frequency noise and offset. A chopper is used in the Miller feedback path. This chopper adjusts the phase of the Miller path by 180 degrees when chop is active.

Reference herein to "one embodiment", "an embodiment", or similar formulations, means that a particular feature, structure, operation, or characteristic described in connection with the embodiment, is included in at least one embodiment of the present invention. Thus, the appearances of such phrases or formulations herein are not necessarily all referring to the same embodiment. Furthermore, various particular features, structures, operations, or characteristics may be combined in any suitable manner in one or more embodiments.

The terms semiconductor device, microelectronic device, integrated circuit, chip, LSI, VLSI, ASIC, and system-on-a-chip, are also sometimes used interchangeably in this field. The present invention relates to all of the foregoing as these terms are commonly understood in the art.

FET, as used herein, refers to metal-oxide-semiconductor field effect transistors (MOSFETs). These transistors are also known as insulated gate field effect transistors (IGFETs).

Terminal refers to a connection point. Typically, outputs, or output terminals, are coupled to inputs, or input terminals, to propagate signals.

Conventionally, chopper amplifiers use parallel compensation to AC ground. In many cases, this compensation requires very large capacitors to guarantee adequate pole separation.

Figure 1:
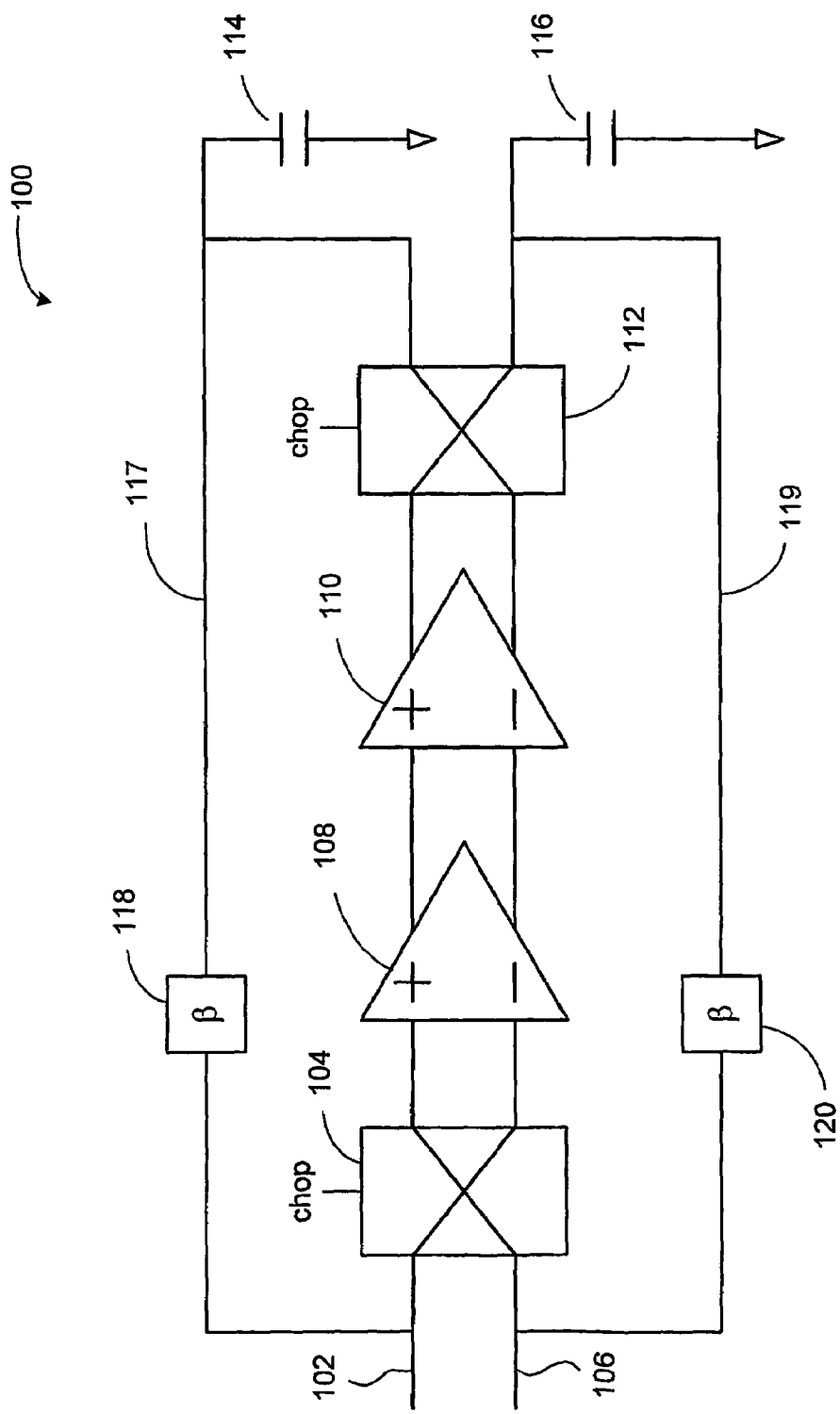
FIG. 1 is a schematic block diagram of an amplifier circuit including choppers in accordance with the prior art.

Referring to FIG. 1, a conventional chopper amplifier 100 is shown. More particularly, chopper amplifier 100 includes a first chopper 104. First chopper 104 includes a first input terminal coupled to a first node 102; a second input terminal coupled to a second node 106, and a third input terminal adapted to receive a first chop control signal, such as for example, a clock signal. First chopper 102 includes two output terminals, coupled respectively to two input terminals of a first gain stage 108. First gain stage 108 includes two output terminals which are coupled respectively to two input terminals of a second gain stage 110 as shown in FIG. 1. Second gain stage 110 includes two output terminals which are coupled respectively to a first input terminal and a second input terminal of a second chopper 112. Second chopper 112 also includes a third input terminal adapted to receive a second chop control signal, such as for example, a clock signal. Second chopper 112 further includes a first output terminal coupled to a node 117 and a second output terminal coupled to a node 119.

The parallel output of chopper amplifier 100 may be taken at nodes 117, 119. The parallel outputs of chopper amplifier 100 may be used to drive additional gain stages. As will be appreciated by those skilled in the art, there are a variety of well-known circuit-level implementations of gain stages and choppers. For example, choppers may be implemented with FETs to switch the signal pathways.

FIG. 1 further illustrates the implementation of parallel compensation to AC ground. More particularly, a first capacitor 114 is shown coupled in series between the first output terminal of the second chopper (i.e., node 117) and ground; and a second capacitor 116 is shown coupled in series between the second output terminal of the second chopper (i.e., node 119) and ground. When such capacitors are implemented on an integrated circuit, a relatively large area of the integrated circuit is consumed. It is noted that the cost of an integrated circuit increases as its area increases.

Still referring to FIG. 1, the illustrative conventional chopper amplifier includes a first feedback path from the first output terminal of the second chopper 112 (i.e., node 117) to the first input terminal of the first chopper 104 (i.e., node 102); the first feedback pathway including a block 118 representing the signal processing (e.g., amplification, attenuation) of the first feedback path. Such signal processing may be the result of a gain stage included in the feedback path. The illustrative conventional amplifier further includes a second feedback path from the second output terminal of the second chopper 112 (i.e., node 119) to the second input terminal of the first chopper 104 (i.e., node 106); the second feedback pathway including a block 120 representing the signal processing (e.g., amplification, attenuation) of the second feedback path. Such signal processing may be the result of a gain stage included in the feedback path.

In a cascode amplifier configuration the dominant pole is formed at the output node. Compensation in multi-stage chopper amplifiers is used so as to have one dominant pole. It is desirable to avoid net positive feedback around the compensation loop.

In order to reduce the area consumed by the compensation capacitors in a chopper amplifier circuit, it is possible to use Miller compensation capacitors. As will be appreciated by those skilled in the art, using a Miller capacitance arrangement effectively multiplies the effect of the capacitor. Unfortunately, using a Miller capacitance compensation configuration causes instability because half of the time the choppers introduce a 180 degree phase shift in the Miller capacitor feedback path.

Various amplifier embodiments in accordance with the present invention include compensation based on the use Miller capacitance which results in greater area efficiency and higher bandwidth designs, as compared with the use of conventional parallel compensation capacitors between the output and ground.

Use of Miller compensation allows the use of smaller capacitors and affords stability with higher bandwidth. However, this cannot be done without phase correction in certain configurations. The use of Miller compensation results in low frequency positive feedback during half of the chopper operation.

Figure 2:
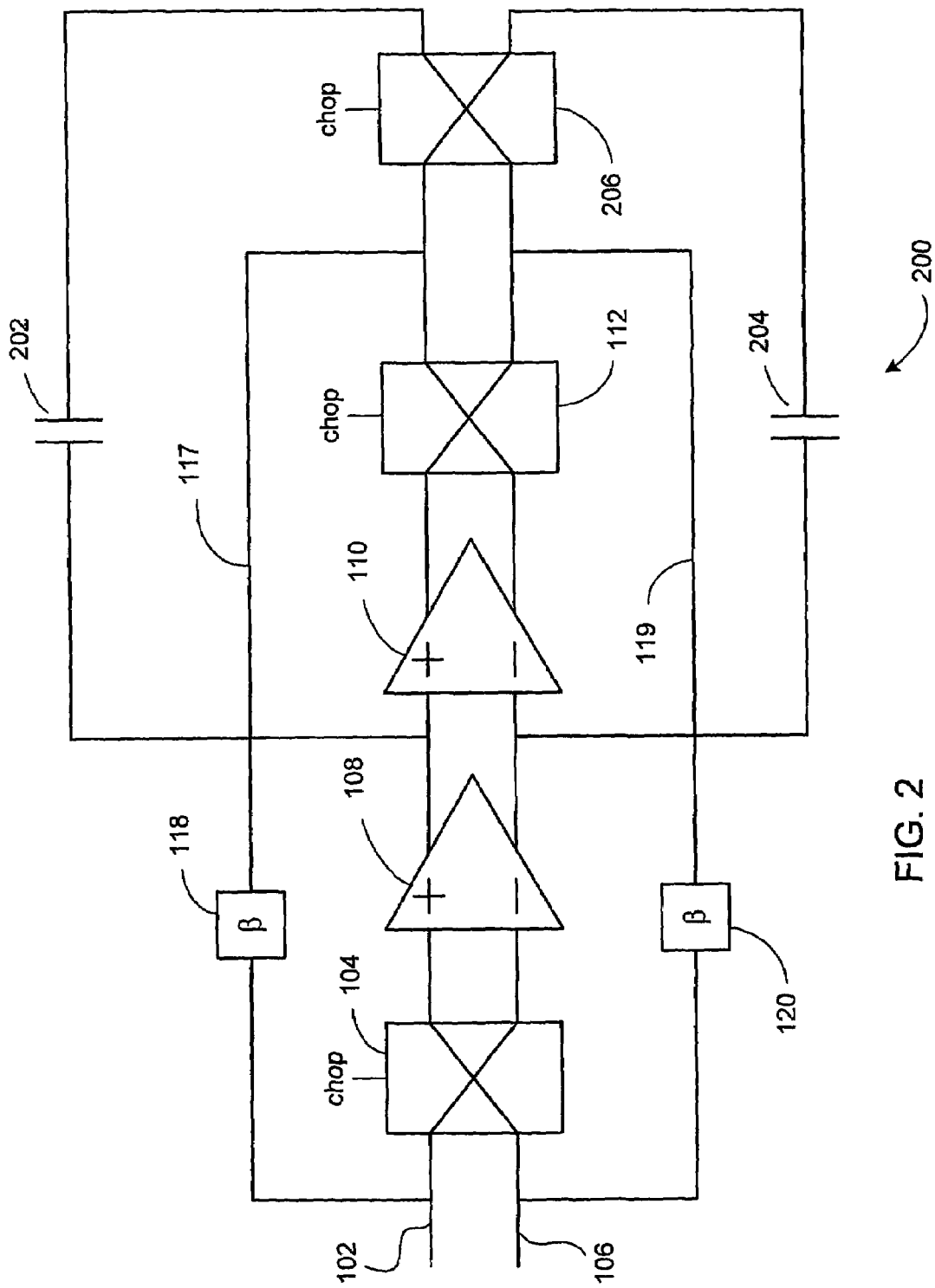
FIG. 2 is a schematic block diagram of an amplifier circuit including choppers in accordance with the present invention.

Referring to FIG. 2, a multi-stage chopper amplifier 200 having a Miller capacitance feedback path, that is chopped in accordance with the present invention, is shown. More particularly, chopper amplifier 200 includes a first chopper 104. First chopper 104 includes a first input terminal coupled to a first node 102; a second input terminal coupled to a second node 106, and a third input terminal adapted to receive a first chop control signal, such as for example, a clock signal. First chopper 102 includes two output terminals, coupled respectively to two differential input terminals of a first gain stage 108. First gain stage 108 includes two differential output terminals which are coupled respectively to two differential input terminals of a second gain stage 110 as shown in FIG. 2. Second gain stage 110 includes two differential output terminals which are coupled respectively to a first input terminal and a second input terminal of a second chopper 112. Second chopper 112 also includes a third input terminal adapted to receive a second chop control signal. Second chopper 112 further includes a first output terminal coupled to a node 117 and a second output terminal coupled to a node 119. In this illustrative embodiment of the present invention, gain stages 108 and 110 are differential amplifier circuits.

The parallel output of multi-stage chopper amplifier 200 may be taken at nodes 117, 119. The parallel outputs of chopper amplifier 200 may be used to drive additional gain stages.

Still referring to FIG. 2, a third chopper 206 has a first input terminal coupled to the first output terminal of the second chopper (i.e., node 117), and has a second input terminal coupled to the second output terminal of the second chopper (i.e., node 119). Third chopper 206 has a first output terminal coupled to a first terminal of a first capacitor 202, and has a second output terminal coupled to a first terminal of a second capacitor 204. First capacitor 202 has a second terminal coupled to the first input terminal of gains stage 110. Second capacitor 204 has a second terminal coupled to the second input terminal of gain stage 110. In this way, a chopper is introduced into the Miller capacitance compensation loop.

In operation, the first chopper 104 is arranged for alternately coupling either node 102 and node 106 respectively to the first (positive) and second (negative) input terminals of the gain stage 108 during a first phase of the chop control signal; or node 106 and node 102 respectively to the first (positive) and second (negative) input terminals of the gain stage 108 during a second phase of the chop control signal. Second chopper 112 and third chopper 206 are similarly arranged to function such that the signals on their first and second input terminals are alternately coupled to their first and second respective output terminals during a first phase of the chop control signal, and to their second and first respective output terminals during a second phase of the chop control signal.

FIG. 2 also shows, in the illustrative embodiment of a chopper amplifier a first feedback path from the first output terminal of the second chopper 112 (i.e., node 117) to the first input terminal of the first chopper 104 (i.e., node 102); the first feedback pathway including a block 118 representing the signal processing (e.g., amplification, attenuation) of the first feedback path. Such signal processing may be the result of, for example, a gain stage included in the feedback path. The illustrative embodiment further includes a second feedback path from the second output terminal of the second chopper 112 (i.e., node 119) to the second input terminal of the first chopper 104 (i.e., node 106); the second feedback pathway including a block 120 representing the signal processing (e.g., amplification, attenuation) of the second feedback path. Such signal processing may be the result of, for example, a gain stage included in the feedback path.

As will be appreciated by those skilled in the art, there are a variety of well-known circuit-level implementations of gain stages and choppers. Similarly, there are a number of physical structures typically formed in integrated circuits that may be used to implement the capacitors of the feedback path. Structures used to form capacitors in integrated circuits include, but are not limited to, metal-to-metal capacitors, polysilicon-to-polysilicon capacitors, metal-to-polysilicon capacitors, junction capacitors, and gate-to-substrate (i.e., FET) capacitors. In some semiconductor processes, high-k dielectric material is available between layers of conductive materials to help facilitate the implementation of capacitors consuming a relatively small area of the integrated circuit. Such capacitors may be implemented as a single structure, or as a plurality of interconnected capacitive elements arranged to provide the desired capacitance. The present invention is not limited to any particular physical implementation of the feedback capacitors.

Chopped Miller capacitors may also be used in nested chopper amplifier circuits. Nested choppers are used to remove residual switching transients from the original chopper operation. It is noted that careful analysis of alternative configuration is required to ensure that all phase permutations are properly handled. In other words, the phase permutations should result in negative feedback, not positive feedback.

Multi-stage chopped amplifiers in accordance with the present invention provide capacitive feedback using Miller capacitance to reduce the physical area required by the feedback capacitors, and further include a feedback chopper in the Miller capacitance path to adjust the phase of the feedback by 180 degrees when chopping is active.

Embodiments of the present invention have a wide variety of applications, including but not limited to sigma-delta data converters.

It is to be understood that the present invention is not limited to the embodiments described above, but encompasses any and all embodiments within the scope of the subjoined Claims.

What is claimed is:

1. A circuit, comprising: a first chopper having a pair of input terminals and a pair of output terminals; a first differential amplifier having a pair of input terminals coupled to the pair of output terminals of the first chopper, the first amplifier further having a pair of output terminals; a second differential amplifier having a pair of input terminals coupled to the pair of output terminals of the first amplifier, the second amplifier further having a pair of output terminals; a second chopper having a pair of input terminals coupled to the pair of output terminals of the second amplifier, the second chopper further having a pair of output terminals; and a third chopper having a pair of input terminals coupled to the output terminals of the second chopper and a pair of output terminals coupled to the input terminals of the second amplifier; wherein the third chopper is adapted to adjust the phase of a differential feedback signal.

2. The circuit of claim 1, further comprising at least one capacitor connected between a first output terminal of the third chopper and a first input terminal of the second differential amplifier; and at least one capacitor connected between a second output terminal of third chopper and a second input terminal of the second differential amplifier.

3. The circuit of claim 2, wherein the third chopper is adapted to adjust the phase of the feedback signal by 180 degrees.

4. The circuit of claim 2, wherein the first, second, and third choppers are adapted to operate synchronously with each other.

5. The circuit of claim 4, wherein the first, second, and third choppers comprise FETs.

6. The circuit of claim 2, wherein the capacitors comprise FETs.

* * * * *